US012407184B2

(12) United States Patent
Stuart

(10) Patent No.: US 12,407,184 B2
(45) Date of Patent: Sep. 2, 2025

(54) DISTRIBUTION LINE GROUND FAULT PREVENTION WITH BLOWN FUSE PROTECTION ON SINGLE PHASE

(71) Applicant: Robert B. Stuart, San Tan Valley, AZ (US)

(72) Inventor: Robert B. Stuart, San Tan Valley, AZ (US)

(73) Assignee: Milo Group LLC, Casper, WY (US)

( * ) Notice: Subject to any disclaimer, the term of this patent is extended or adjusted under 35 U.S.C. 154(b) by 0 days.

(21) Appl. No.: 18/936,543

(22) Filed: Nov. 4, 2024

(65) Prior Publication Data

US 2025/0062639 A1 Feb. 20, 2025

Related U.S. Application Data

(63) Continuation-in-part of application No. 18/920,865, filed on Oct. 19, 2024, which is a continuation-in-part of application No. 18/464,596, filed on Sep. 11, 2023, now abandoned, which is a continuation-in-part of application No. 18/448,914, filed on Aug. 12, 2023, now abandoned, which is a continuation-in-part of application No. 18/064,152, filed on Dec. 9, 2022, now Pat. No. 11,852,692.

(51) Int. Cl.
*H02J 13/00* (2006.01)
*H02J 3/00* (2006.01)

(52) U.S. Cl.
CPC ........ *H02J 13/0004* (2020.01); *H02J 3/0012* (2020.01); *H02J 13/00002* (2020.01)

(58) Field of Classification Search
CPC .............. H02J 13/0004; H02J 13/0012; H02J 13/00002; H02J 3/0012; G01R 31/085; G01R 31/086; G01R 31/088; G01R 31/52; G01R 31/54; G01R 19/2513; H02H 5/10
See application file for complete search history.

(56) References Cited

U.S. PATENT DOCUMENTS

| | | | | | |
|---|---|---|---|---|---|
| 4,600,961 | A | * | 7/1986 | Bishop | H02H 3/343 361/76 |
| 4,686,601 | A | * | 8/1987 | Alexander | H02H 3/402 361/76 |
| 2021/0203153 | A1 | * | 7/2021 | Akke | H02H 7/26 |

* cited by examiner

*Primary Examiner* — Lee E Rodak
*Assistant Examiner* — Demetrius R Pretlow
(74) *Attorney, Agent, or Firm* — Wilkinson Law Office; Clinton H. Wilkinson

(57) ABSTRACT

A system for preventing ground fault or other short circuit in electric distribution line system, caused by a break in a line, utilizing programmable relay protection in a plurality of relay devices programmed to monitor high sensitivity parameters, includes blown fuse protection in a single phase tap line to prevent false operation of the open conductor logic when a tap line fuse successfully interrupts a short circuit on the tap line, which includes: blown fuse protection subsystem having relay devices on the tap lines (vis transformers) that have microprocessors programmed to detect changes in negative sequence overcurrent on a single phase tap line, to calculate the change in negative sequence overcurrent, to store a preset acceptable range for change of negative sequence overcurrent, to compare the calculated change in negative sequence overcurrent to the preset acceptable range for change of negative sequence overcurrent.

14 Claims, 7 Drawing Sheets

In a system for preventing ground fault in electric distribution line system caused by a break in a line, the improvement of blown fuse protection in a single phase tap line to prevent false operation of the open conductor logic when a tap line fuse successfully interrupts a short circuit on the tap line. The blown fuse protection subsystem has sufficient hardware and software that is programmed: to detect changes in negative sequence overcurrent on a single phase tap line, to calculate the change in negative sequence overcurrent, to store a preset acceptable range for change of negative sequence overcurrent, to compare said calculated change in negative sequence overcurrent to said preset acceptable range for change of negative sequence overcurrent. a) If there is a signal indicating a potential line break fault from the high sensitivity monitoring and, if the calculated change in negative sequence overcurrent is within said preset acceptable range for change of negative sequence overcurrent, then there is no blown fuse, and the blown fuse protection subsystem signals to permit said high sensitivity monitoring to proceed to signal a true broken conductor for line shut down of said tap line; and, b) if there is a signal indicating a potential line break fault from the high sensitivity monitoring and, if the calculated change in negative sequence overcurrent is outside said preset acceptable range of change of negative sequence overcurrent, then there is a blown fuse, and the high sensitivity monitoring does not proceed to signal a true line break fault for line shut down of said tap line.

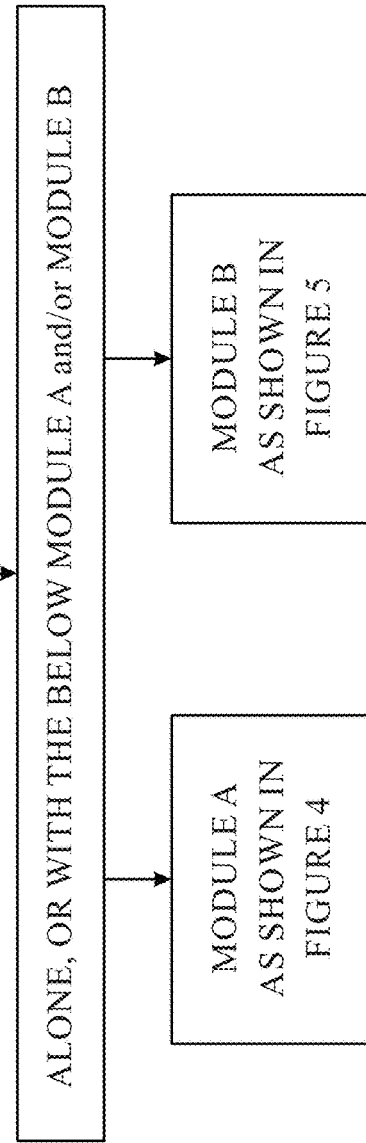

FIGURE 3

DISTRIBUTION LINE GROUND FAULT PREVENTION WITH BLOWN FUSE PROTECTION ON SINGLE PHASE

REFERENCE TO RELATED APPLICATIONS

This application is a continuation in part of co-pending United States utility patent application titled "Electric Distribution Line Ground Fault Prevention Device Using Dual Parameter High Sensitivity Monitoring Small Current Reduction With Small Increase In Negative Sequence Current", and having an application Ser. No. 18/920,865, filed on Oct. 19, 2024, and having common inventorship therewith, which was a continuation in part of co-pending United States utility patent application titled "Electric Distribution Line Ground Fault Prevention Systems Using Dual Parameter High Sensitivity Relay Device, Monitoring Small Current Reduction With Small Increase In Negative Sequence Current", and having an application Ser. No. 18/464,596, filed on Sep. 11, 2023, and having common inventorship therewith, which was a continuation in part of co-pending United States utility patent application titled "Electric Distribution Line Ground Fault Prevention Systems Using Dual Parameter High Sensitivity Relay Device Monitoring With Blown Fuse Protection In A Single Phase Tap Line", and having an application Ser. No. 18/448,914, filed on Aug. 12, 2023 and having common inventorship therewith. This application is also a continuation in part of co-pending United Stated utility patent application titled "Electric Distribution Line Ground Fault Prevention Systems Using Dual Parameter Monitoring With High Sensitivity Relay Devices", and having an application Ser. No. 18/064,152, filed on Dec. 9, 2022, and having common inventorship therewith.

INCORPORATION BY REFERENCE

United States utility patent application titled "Electric Distribution Line Ground Fault Prevention Systems Using Dual Parameter Monitoring With High Sensitivity Relay Devices", and having an application Ser. No. 18/064,152, filed on Dec. 9, 2022 (hereinafter designated as the "Parent Application") is hereby incorporated herein by reference in its entirety. This application, therefore, includes all of the drawings and full specification of U.S. utility patent application Ser. No. 18/064,152, as if presented in print herein.

United States utility patent application titled "Electric Distribution Line Ground Fault Prevention Systems Using Dual Parameter High Sensitivity Relay Device Monitoring With Blown Fuse Protection In A Single Phase Tap Line", and having an application Ser. No. 18/448,914, filed on Aug. 12, 2022, is hereby incorporated herein by reference in its entirety. This application, therefore, includes all of the drawings and full specification of U.S. utility patent application Ser. No. 18/448,914, as if presented in print herein.

BACKGROUND OF INVENTION a. Field of Invention

Three phase electric distribution systems are prone to failing lines that cause ground faults or other short circuits. Most three phase distribution lines also have branches to serve residential-type needs, and these are single phase "tap" lines. Typically, the failures result from breaks in an individual line, connection breaks, object intersection, aging, adverse weather, support structure failure, etc. For example, such lines that were built decades ago have aged to the point where conductors (lines) separate from splices, or otherwise break and open with dangling wires (jumpers). These double jumpers may slap against poles with conduits or otherwise ground to cause fires and/or injury to structures, persons, animals and wildlife and flora.

Historically, the industry has focused attention to preservation of distribution lines, transformers, generators and substations by monitoring systems for shorts and ground faults, reacting according to the concept of best methods for preserving equipment and maintaining best (least interrupted) services to the load (consumers). Thus, for decades and presently, the industry utilizes preprogrammed relays that monitor operating conditions to identify shorts and to shut down electricity on the shorted line and isolate to provide electricity to the consumer. These relays react once a ground fault or other short has occurred. These prior art relays have a sensitivity of about 1 amp, generally being about 0.5 amps sensitivity at best, and not as low as 0.1 amps sensitivity. These "low sensitivity" relays are incapable of sensing, much less monitoring, parameters that operate (flow) at lower amps than these low sensitivity limited relays. The present invention is directed to a very different approach—the use of methods, devices and systems that focus on identifying a break in a line before a short or ground fault occurs, thereby preventing disasters that may result from such shorts and ground faults. There are about 1.3 to 1.7 seconds between the time a line breaks and the time a short occurs (i.e., the time it takes to touch a foreign conductor, such as ground, pole, building or other object). The present invention is directed to unique systems and devices to see the break in real time within fractions of a second, even milliseconds, and to likewise shut down the line (trip the circuit breaking device) within fractions of a second and, hence, before any short occurs, avoid many possible disasters. This is achieved by micro-monitoring, looking at different parameters (operating conditions) from those used in the prior art relays, and reacting nearly instantaneously. Specifically, in the field on the distribution system, relays high sensitivity relays are positioned to monitor very low flow rate parameter functions to prevent ground fault disasters. "High sensitivity" relays as used herein means relays that can measure/monitor parameters at 0.1 amps or lower, such as 0.05 amps or lower. Preferred are high sensitivity relays that can operate as low as 0.01 amps and most preferred are relays that can operate at or below 0.001 amps. For the usual distribution system that has the primary three phase lines and secondary tap lines (single phase) the present invention contemplates two different sets of parameters being measured, as well as preferred additional monitoring to eliminate false conclusions about whether or not a line has broken. This present invention, within the context of the Parent Application Systems and Methods, and any other high sensitivity reliable monitoring system such as in JED-106C referenced above, is specifically added thereto for the purpose of improved micro-sensitivity at locations along the distribution lines that are remotely located from the substations and typically miles from the relay at the substation, for example, micro changes of 2 amps primary. The systems of this present invention, aka remote sensitivity, are similar to the systems set forth in JED-106C for the blown fuse protection in a single-phase tap line to prevent false operation of the open conductor logic when a tap line fuse successfully interrupts a short circuit on the tap line. However, the present invention systems now specify the physical relay having a microprocessor and monitors. Also, preferred embodiments include a rising edge timer (leading edge timer with drop out timer) not included in the incorporated application JED-106C and not included in the Parent Application.

b. Description of Related Art

The following patents are representative of prior art of interest to the present invention:

U.S. Pat. No. 6,518,767 to Roberts et al. describes a power line current differential protection system. All three phase current values ($I_A$, $I_B$ and $I_C$) are obtained from both the local end and the remote end of a power transmission line. The magnitude of the ratio of the remote current values to the local current values are calculated. Also, the angle difference between the local and the remote current values for each phase are calculated. Comparison elements then compare the ratio and angle values against preselected values which establish a restrain region in the current ratio plane. Current values which result in the ratio being within the region do not result in a tripping signal for the circuit breaker on the power transmission line, while current values which result in a ratio outside of the region result in a tripping of the circuit breaker. Similar circuitry is used for negative sequence current quantities, with the negative sequence preselected values being set substantially lower to produce a more sensitive response to possible faults in the line.

U.S. Pat. No. 10,197,614 to Benmouyal et al. illustrates the errors that are encountered when using both single-ended and double-ended normal-mode fault location calculations when a fault occurs in a pole-open condition. The disclosure provides systems and methods for accurately calculating the location of faults that occur during pole-open conditions, including single-ended approaches and double-ended approaches.

U.S. Pat. No. 10,340,684 to Sridharan et al. describes how a location of a broken electrical conductor of an electric power delivery system may be detected by monitoring a rate of change of phase voltage and/or a rate of change of zero-sequence voltage at various points on the conductor. Intelligent electronic devices (IEDs) such as phasor measurement units may be used to obtain measurements and calculate synchrophasors. The synchrophasors may be used by a central controller to determine which two continuous IEDs measure rates of change of voltages of opposite polarities, where the broken conductor is between the two continuous IEDs. The synchrophasors may be used by a central controller to determine which two continuous IEDs where one exhibits a zero-sequence voltage magnitude that exceeds a predetermined threshold for a predetermined time, wherein the zero-sequence voltage magnitude of the other of the continuous IEDs does not exceed the predetermined threshold.

U.S. Pat. No. 10,823,777 to Dase et al. relates to detecting a broken conductor in a power transmission line. In an embodiment, a processor receives a signal indicating current on the transmission line. The processor determines that a broken conductor is present on the transmission line based at least in part on a magnitude of the current being less than a line charging current of the transmission line and a phase angle of the current leading a respective phase voltage of the transmission line. The processor effects a control operation based on the determined broken conductor.

U.S. Pat. No. 10,955,455 to Thompson et al. pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine an operating vector. A processing subsystem may be configured to receive the operating vector from the sensor and to identify when the operating vector is outside of a range defined by a rest vector and a threshold value. In certain embodiments, the threshold may comprise a three-dimensional sphere. The processing subsystem may determine that the conductor is broken based on the operating vector remaining outside of the range for a period of time determined by the timer subsystem. A signal may be transmitted by the communication subsystem to indicate that the conductor is broken.

U.S. Pat. No. 11,211,788 to Wade et al. describes how systems and methods may mitigate risk of fire caused by an electric power system. In one embodiment, a system may include an intelligent electronic device (IED). The IED includes a communication subsystem to receive a signal from a sensor related to a condition of the electric conductor. A processing subsystem in communication with the communication subsystem may operate in at least two modes comprising a high security mode and a fire prevention mode. In the fire prevention mode, the IED may interrupt a flow of electric current based on the signal from the at least one sensor associated with the electric conductor. In the high security mode, the system may interrupt a flow of electric current based on the signal from the at least one sensor associated with the electric conductor and based on a second condition relating to the electric conductor.

US Publication No. 20190317143 to Gangadhar et al. relates to detecting a broken conductor in a power transmission line. In an embodiment, a processor receives a signal indicating current on the transmission line. The processor determines that a broken conductor is present on the transmission line based at least in part on a magnitude of the current being less than a line charging current of the transmission line and a phase angle of the current leading a respective phase voltage of the transmission line. The processor effects a control operation based on the determined broken conductor.

US Publication No. 20190324074 to Thompson et al. pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine an operating vector. A processing subsystem may be configured to receive the operating vector from the sensor and to identify when the operating vector is outside of a range defined by a rest vector and a threshold value. In certain embodiments, the threshold may comprise a three-dimensional sphere. The processing subsystem may determine that the conductor is broken based on the operating vector remaining outside of the range for a period of time determined by the timer subsystem. A signal may be transmitted by the communication subsystem to indicate that the conductor is broken.

US Publication No. 20210048486 to Bell et al. describes systems for determining a broken conductor condition in a multiple-phase electric power delivery system. It has been observed that broken conductors pose a safety concern when occurring in the presence of people or vulnerable environmental conditions. Broken conductor conditions disclosed herein may be used to detect and trip the phase with the broken conductor, thus reducing or even eliminating the safety risk. Further, a distance to the opening may be determined.

US Publication No. 20210091559 to Mobley et al. pertains to detection of a broken conductor in an electric power system. In one embodiment, a broken conductor detector may be configured to be mounted to an electrical conductor and may comprise a communication subsystem configured to transmit a signal configured to indicate that the conductor is broken. A sensor may determine a plurality of vectors. A processing subsystem may be configured to receive the plurality of vectors from the sensor and to identify when the vector is outside of a range defined by a threshold value. The processing subsystem may determine that the conductor is falling based on the plurality of vectors remaining outside of the threshold for a period of time determined by the timer subsystem. A signal may be transmitted by the communication subsystem to indicate that the conductor is falling.

US Publication No. 20210265834 to Wade et al. describes how systems and methods may mitigate risk of fire caused by an electric power system. In one embodiment, a system may include an intelligent electronic device (IED). The IED includes a communication subsystem to receive a signal from a sensor related to a condition of the electric conductor. A processing subsystem in communication with the communication subsystem may operate in at least two modes comprising a high security mode and a fire prevention mode. In the fire prevention mode, the IED may interrupt a flow of electric current based on the signal from the at least one sensor associated with the electric conductor. In the high security mode, the system may interrupt a flow of electric current based on the signal from the at least one sensor associated with the electric conductor and based on a second condition relating to the electric conductor.

Published article 2016 IEEE "Catching Falling Conductors in Midair-Detecting and Tripping Broken Distribution Circuit Conductors at Protection Speeds" by William O'Brien, Eric Udren, Kamal Garg, Dennis Haes, and Bala Sridharan describes how when an overhead electric power distribution circuit conductor breaks—for example, when a car strikes a pole or a splice or clamp fails—the energized conductor falls to ground. The resulting high-impedance ground fault may be difficult or impossible to detect by relays located in the substation. In any case, no ground fault protection relay can operate until well after the time the fault has occurred-after the falling energized conductor has hit the ground and created a hazardous situation. For decades, utilities and equipment manufacturers have worked to develop methods for tripping these hazardous ground faults as quickly as possible. This paper describes a new falling conductor detection scheme that trips the affected circuit section in the narrow time window between the moment of the break and the time the conductor hits the ground. The affected circuit section is de-energized while the conductor is still falling, eliminating the risk of an arcing ground fault or energized circuits on the ground.

Published article 2019 Schweitzer Engineering Laboratories, Inc. "Detecting and Locating Broken Conductor Faults on High-Voltage Lines to Prevent Autoreclosing Onto Permanent Faults" by Kanchanrao Dase, Sajal Harmukh, and Arunabha Chatterjee describes how broken-conductor detection is challenging because the conductor may remain suspended without causing any fault current. Even if the conductor falls to the ground, the fault current might remain low, depending on the fault resistance. For low-resistance faults, a relay can detect faults and trip the line breakers. However, because the relay cannot determine whether the fault is permanent, it may attempt to reclose, causing further stress to the power system. This paper describes a new algorithm that uses only single-ended measurements to reliably detect broken conductors and estimate their location by using the charging current of the line. The phase angle of this current leads the voltage by about 290°, and the magnitude is a function of line length. This method is suitable for power lines that have measurable charging current, and it detects broken conductors successfully if the relay can measure the charging current while the conductor is falling in midair. Broken-conductor detection can be used to trip the breakers before the conductor touches the ground and creates a shunt fault. Thus, the algorithm can prevent such faults and block any attempt to reclose the line. Detecting broken conductors and their location information provided by the algorithm can help in quickly resolving broken-conductor faults. This paper presents three field events from 57.1 kV and 220 kV lines and results from Electromagnetic Transients Program (EMTP) simulations that validate the algorithm.

U.S. Pat. No. 9,753,096 to Kim and related U.S. Pat. No. 8,866,626 to Kim both describe a method, system and computer software for detecting an incipient failure of a generator in a power system including the steps of ascertaining one or more generator reference parameter of the generator for use as a baseline reference; measuring one or more operating parameter values of the generator; using the one or more operating parameter values to solve for an estimated present value of the one or more of the generator's current performance parameters using particle swarm optimization technique; and determining whether the estimated present values of the one or more of the generator's current performance parameters are outside of an acceptable limit.

U.S. Pat. No. 7,345,456 to Gibbs et al. describes a stabilizer and synchronous electric power generator system using same that provides both power system damping and excitation limiter functionality. The stabilizer includes a processing unit and a memory storing routines executable by the processing unit. The routines are adapted to receive a voltage signal indicative of a voltage and a current signal indicative of a current output by the generator system, generate, utilizing the voltage and current signals, a power system stabilizer signal for damping oscillations and one or more excitation limiter function signals for controlling excitation level. The routines are also adapted to generate a feedback signal for the generator system by combining the power system stabilizer signal and one or more of the one or more excitation limiter function signals.

U.S. Pat. No. 5,761,073 to Dickson describes a programmable autosynchronizer for use with a system having generator and bus voltages and having a breaker circuit for connecting the generator and bus voltages to each other. The autosynchronizer synchronizes the frequency and phase of the generator and bus AC voltages by controlling the generator voltage. A microprocessor compares the frequencies of generator and bus voltage signals, the microprocessor generating a proportional difference signal having a parameter representative of a proportional difference in frequency between the generator and bus voltage signals. The proportional correction range extends within the synchronization range. The microprocessor permits a sync signal when the frequency difference of the frequencies of the generator and bus voltage signals is within the synchronization frequency range. A first output circuit responsive to the proportional difference signal provides a correction signal to the generator for varying the frequency of the generator. A second output circuit responsive to the sync signal provides a breaker close signal to the breaker circuit for closing the breaker thereby enabling connection of the generator and bus voltages. A frequency correction dead band within the frequency range and a target slip band within the dead band define a zone of limited proportional correction to nudge the generator into synchronization and prevent a hung scope.

U.S. Pat. No. 5,751,532 to Kanuchok, et al. describes a relay for monitoring an electrical system to protect the electrical system from an overcurrent condition as a time dependent function of an electrical current level in the electrical system is disclosed. The relay includes a memory which stores a current level count and a current level detector coupled to the electrical system which detects the electrical current level in the electrical system over time. A microprocessor responds to the current level detector by varying the current level count in the memory as a function of the electrical current level over time. The microprocessor also detects an occurrence of the electrical current level falling below a minimum current level. A timer responds to the microprocessor by measuring a period of time during which the electrical current level is less than the minimum current level. The microprocessor responds to the timer by varying the current level count in the memory as a function of the measured period of time during which the electrical current level is below the minimum current level. A method of monitoring an electrical system to protect the electrical system from an overcurrent condition as a time dependent function of an electrical current level in the electrical system is also disclosed. Other apparatus and methods are also disclosed.

U.S. Pat. No. 5,640,060 to Dickson describes an autosynchronizer for use with a system having generator and bus voltages and having a breaker circuit for connecting the generator and bus voltages to each other. The autosynchronizer synchronizes the frequency and phase of the generator and bus AC voltages by controlling the generator voltage. A microprocessor compares the frequencies of generator and bus voltage signals, the microprocessor generating a proportional difference signal having a parameter representative of a proportional difference in frequency between the generator and bus voltage signals. The proportional correction range extends within the synchronization range. The microprocessor permits a sync signal when the frequency difference of the frequencies of the generator and bus voltage signals is within the synchronization frequency range. A first output circuit responsive to the proportional difference signal provides a correction signal to the generator for varying the frequency of the generator. A second output circuit responsive to the sync signal provides a breaker close signal to the breaker circuit for closing the breaker thereby enabling connection of the generator and bus voltages. A frequency correction dead band within the frequency range and a target slip band within the dead band define a zone of limited proportional correction to nudge the generator into synchronization and prevent a hung scope.

U.S. Pat. No. 5,309,312 to Wilkerson, et al. describes an apparatus for protecting an electrical power system supplying electrical power to an electrical load comprises a transformer for sensing an operating condition of the electrical power system and for producing an analog signal representative of the operating condition, and a microcomputer for periodically sampling the analog signal and for converting the analog signal into a series of digital signals. The microcomputer includes circuitry for deriving a digital value representative of a square root of the series of digital signals and circuitry for processing the digital value over time to determine a processed value which is a function of both the sensed operating condition and time. A circuit breaker is responsive to the microcomputer for disconnecting the power system from the load in the event that the processed value is not within preset limits. The microcomputer also generates a relay signal representative of the status of the relay and the relay includes an output port responsive to the relay signal, for communicating the status of the relay to a remote station.

U.S. Pat. No. 5,014,153 to Wilkerson describes an apparatus for monitoring phased currents in a first winding and a second winding of a transformer and for disconnecting the transformer from a power source supplying the transformer when a difference between the magnitude of the current in the first winding and the magnitude of the current in the second winding exceeds a predetermined amount to indicate a fault condition is disclosed. The apparatus is used in combination with circuitry for generating first and second current signals each having a phase and magnitude which is a function of the phase and magnitude of the phased currents in the first and second windings, respectively. The apparatus includes a circuit for shifting the phase of the second current signal to match the phase of the first current signal, a circuit for detecting a difference between the magnitude of the first current signal and the magnitude of the phase shifted second current signal, and a circuit for disconnecting the transformer from the power source when the detected difference exceeds the predetermined amount.

U.S. Pat. No. 4,788,619 to Ott, et al. describes a protective relay for use in an electrical power system having electrical conductors which are energized with an AC voltage. The protective relay includes a circuit for sensing the AC voltage to produce an AC output that has zero crossings and a time period between zero crossings, a circuit for supplying an electrical signal representing a preselected pickup value of volts-per-Hertz for the relay, and a circuit responsive to the AC output and to the electrical signal for generating an electrical level as a function of both the time period and the pickup value and for producing an output signal for the relay when the AC output exceeds the electrical level. In this way, the output signal is produced when a volts-per-Hertz value of the AC voltage exceeds the preselected pickup value of volts-per-Hertz for the relay. Other protective relay apparatus and methods are also disclosed.

U.S. Pat. No. 4,757,416 to Wilkerson describes a protective apparatus for use in an A.C. electrical power system with a circuit breaker for connecting and disconnecting first and second electrical conductors that are electrically energized, the conductors normally having a negligible phase difference of electrical energization when the circuit breaker is closed, and the circuit breaker having auxiliary contacts defining the state of the circuit breaker as open or closed. The protective apparatus includes a circuit responsive to the auxiliary contacts for producing a first signal representative of the state of the breaker as open or closed and another circuit connected to the circuit for producing the first signal and operable when the breaker is closed for generating a second signal when the phase difference of electrical energization of the first and second electrical conductors exceeds a predetermined value. A further circuit provides an indication of malfunction of the circuit breaker when the second signal occurs. Phase window extending apparatus for use in the protective apparatus, methods of operation and other protective apparatus are also disclosed.

In addition to the above, there are non-analogous art teachings that touch upon control systems for power converters, and other electric equipment, that rely upon predetermined fixed level parameters. United States Patent Application Publication 20220085713 A1 to Clemens et al describes a drive system that includes a power converter in which the control system includes a predefined fixed level selected from the group of: fixed over speed, fixed under speed, fixed undercurrent, fixed under power, fixed torque pulsation, fixed negative sequence overcurrent, fixed thermal overload, fixed resistance temperature detector protection, fixed instantaneous overcurrent, fixed zero sequence over voltage, fixed inverse time overcurrent, fixed instantaneous zero sequence over voltage, fixed maximum power factor, fixed minimum power factor, fixed over frequency, fixed under frequency, fixed high frequency rate of change and combinations thereof. However, this reference does not specifically call out the two parameters of the present invention and it is not directed to electric power lines.

In addition to the foregoing, existing commercial relays available for distribution lines now include AND/OR gate programming with microprocessors as well as monitors for numerous parameters (over 20) to detect various changes. However, none teach or are programmed for the specific monitoring combinations set forth in the present invention to detect specific parameters as claimed and disclosed herein. None are able to detect changes in these parameters to shut down broken lines before they reach the ground and thus prevent catastrophes, such as electrocutions and/or fires.

Notwithstanding the prior art, the present invention is neither taught nor rendered obvious thereby.

SUMMARY OF THE INVENTION

The present invention involves an enhanced system in which to monitor three-phase electric distribution line systems by measuring specific high sensitivity parameters with high sensitivity relays that are installed in the system. In the present invention system for preventing ground fault or other short circuit in electric distribution line system, caused by a break in a line, utilizing programmable relay protection in a plurality of relay devices programmed to monitor high sensitivity parameters. The present invention includes blown fuse protection in a single phase tap line to prevent false operation of the open conductor logic when a tap line fuse successfully interrupts a short circuit on the tap line. It includes: a blown fuse protection subsystem includes a plurality of current transformers with relay devices functionally connected to those transformers by being connected to secondary stepdown windings of those current transformers, the relay devices being for monitoring high sensitivity parameters on the tap line distribution circuit. The present invention system thus includes a plurality of relay devices, each having a housing, and having connections with an incoming line and an outgoing line for connection to a current transformer on the tap line distribution circuit, and having a plurality of monitors, and with a programmable microprocessor functionally connected to the monitors, the programmable microprocessor is programmed for micro-monitoring segments of a line, with either a MODULE A, or a MODULE B, or both MODULE A and MODULE B. Thus, the microprocessor is programmed: to detect changes in negative sequence overcurrent on a single phase tap line, to calculate the change in negative sequence overcurrent, to store a preset acceptable range for change of negative sequence overcurrent, to compare said calculated rate of change in negative sequence overcurrent to said preset acceptable range for change of negative sequence overcurrent, and a) if there is a signal indicating a potential line break fault from the high sensitivity monitoring and, if the calculated change in negative sequence overcurrent is within said preset acceptable range for change of negative sequence overcurrent, then there is no blown fuse, and the blown fuse protection subsystem signals to permit said high sensitivity monitoring to proceed to signal a true broken conductor for line shut down of said tap line; and, b) if there is a signal indicating a potential line break fault from the high sensitivity monitoring and, if the calculated change in negative sequence overcurrent is outside said preset acceptable range of change of negative sequence overcurrent, then there is a blown fuse, and the high sensitivity monitoring does not proceed to signal a true line break fault for line shut down of said tap line.

In some embodiments of the present invention, the subsystem includes a blown fuse detection module, designated as module A, having: (i) an instantaneous negative sequence overcurrent monitor; (ii) an instantaneous negative sequence overcurrent imbalance monitor that receives pretimed negative sequence overcurrent readings and provides a calculated change of actual instantaneous negative sequence overcurrent, and said monitor further includes a comparator for comparing said calculated change in instantaneous negative sequence overcurrent to said preset acceptable range for change of instantaneous negative sequence overcurrent; and (iii) an instantaneous undercurrent monitor.

In some embodiments of the present invention, the module A monitors (ii) and (iii) pass through a first AND gate, and then pass through a second AND gate with module A monitor (i), and then collectively pass through a final AND gate.

In some embodiments of the present invention, the subsystem also includes a change of instantaneous undercurrent module, designated as module B, on said tap line to detect (broken conductor) a break in a line.

In some embodiments of the present invention, the instantaneous undercurrent module, that is, module B, includes (i) an instantaneous undercurrent monitor that reads instantaneous undercurrent before a conductor opens; (ii) an instantaneous undercurrent monitor that reads instantaneous undercurrent after a conductor opens; and (iii) an instantaneous zero sequence overcurrent monitor.

In some embodiments of the present invention, the module B monitors (i) and (ii) pass through a third AND gate, and then pass through a fourth AND gate with module B monitor (iii), and then collectively pass through said final AND gate.

In some embodiments of the present invention, the programmable relay protection system plurality of relay devices are programmed to monitor high sensitivity line instantaneous undercurrent, and to monitor high sensitivity instantaneous negative sequence overcurrent to detect current imbalance of the load wherein a distribution tap line has opened due to a blown fuse, and wherein shutting down the power to a broken line is delayed by a preset time within the range of about 0.3 seconds to about 1 second to protect against a false shut down.

In some embodiments of the present invention, the plurality of relay devices includes module A, which is programmed to be highly sensitive so as to monitor and measure instantaneous undercurrent in the range of 0.01 to 0.5 amp.

In some embodiments of the present invention, the plurality of relay devices includes module A, which are programmed to be highly sensitive so as to monitor and measure instantaneous negative sequence overcurrent in the range of 0.01 to 0.5 amp.

In some embodiments of the present invention, the programmable relay protection system plurality of relay devices are programmed to monitor high sensitivity line instantaneous undercurrent, and to monitor high sensitivity instantaneous negative sequence overcurrent to detect current imbalance of the load wherein a distribution tap line has opened, and wherein shutting down the power to a broken line is delayed by a preset time within the range of about 0.3 seconds to about 1 second to protect against a false shut down.

In some embodiments of the present invention, the plurality of relay devices includes module A, which is programmed to be highly sensitive so as to monitor and measure instantaneous undercurrent in the range of 0.01 to 0.5 amp.

In some embodiments of the present invention, the plurality of relay devices includes module A, which is programmed to be highly sensitive so as to monitor and measure instantaneous zero sequence overcurrent in the range of 0.01 to 0.5 amp.

In some embodiments, the MODULE A set on instantaneous undercurrent monitors and said MODULE B set on instantaneous undercurrent monitors are one and the same. To state it differently, a single set of monitors for instantaneous undercurrent with the leading edge timer and drop out timer, may be used for comparative data both MODULES.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention and are incorporated in and constitute a part of this specification, illustrate preferred embodiments of the invention and together with the detail description serve to explain the principles of the invention. In the drawings:

FIG. 3 is a block diagram showing some of the features of a Present Invention electric distribution relay protection system device that includes high sensitivity relays included on the distribution line transformers, with small change monitoring of selected parameters;

DETAILED DESCRIPTION OF THE INVENTION

Figure 1:
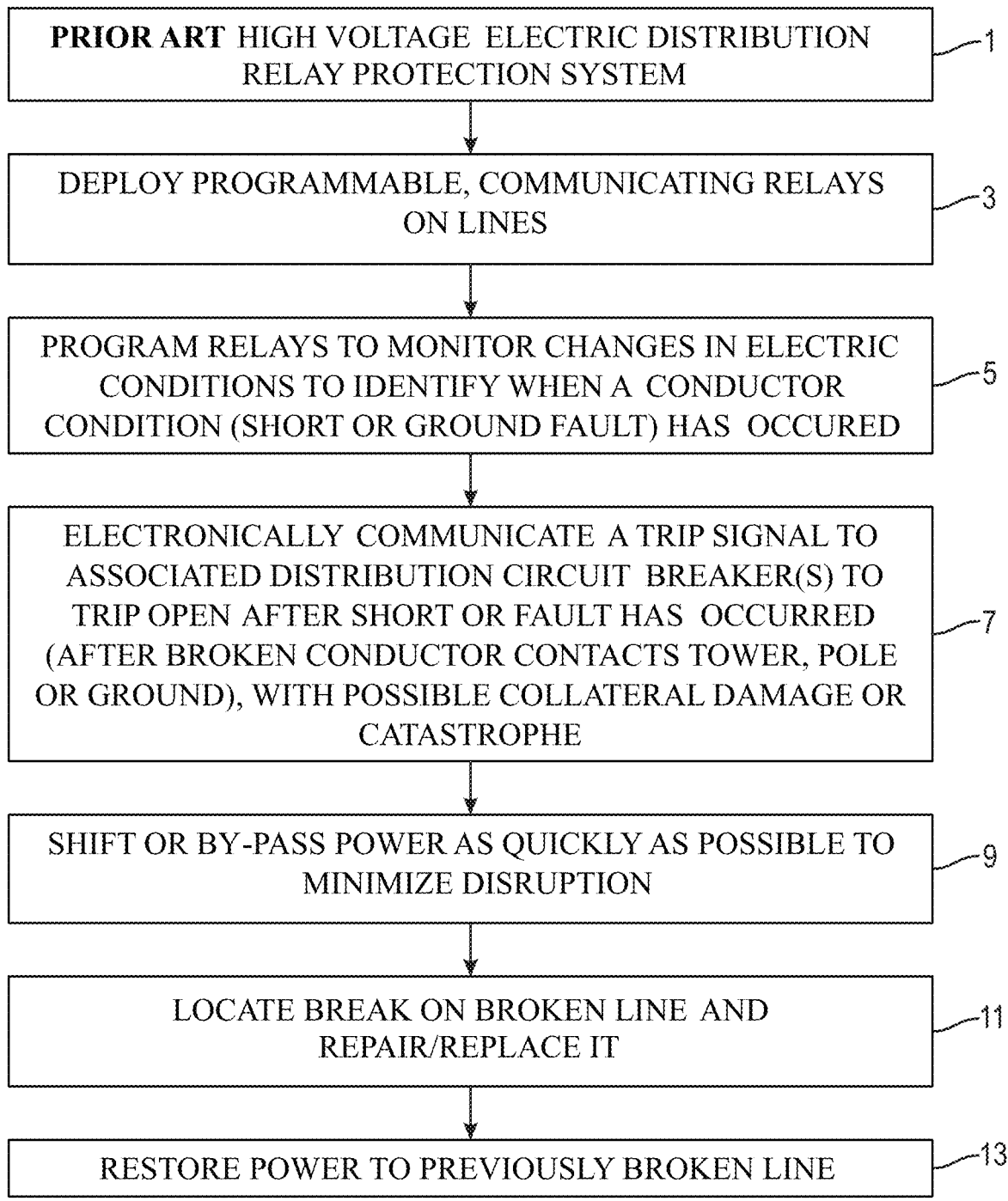
FIG. 1 is a block diagram showing some of the features of a Prior Art electric distribution relay protection system having low sensitivity relays.

Electricity begins with production of power, i.e. the source, in the form of any electric-producing-facility, fossil fuel power plant, hydroelectric, wind farm, solar form, hybrid, co-generation, etc. When electricity is produced, it is next distributed and then consumed. The four major aspects are production, transmission, distribution and consumption. Transmission usually begins with high voltage (sometimes called high tension) lines transmitting from the source, through the lines, to the load. Distribution involves step-down substations with transformers and other components to regulate electric flow. It is well known that resistance will cause huge drops in delivered electricity to the load, and it is well known that the negative effect of resistance along the lines (wires) can be significantly reduced by lowering the current and increasing the voltage. As an example, a 110 volt line could lose over 70% of its value before reaching a load, depending upon line material and distance, whereas high voltage lines operating at very high voltages, such as 345 kilovolts, might lose only 0.5% of its value to the load over many miles. When the transmission lines reach the distribution substations, the three phase distribution lines take over and distribute three phase electricity to consumers in need of three phase, such as industrial, commercial and institutional facilities, and then are further distributed to end user consumers, such as residences, with only single phase lines. The present invention is directed to detecting and shutting down open distribution lines before they ground, including both three phase and single phase lines (the latter sometimes referred to as tap lines) to prevent potentially catastrophic collateral damage, such as fires, electrocutions, etc. Unlike transmission lines, distribution lines have significantly different amperage flows, depending upon the location on the line. And further, there are additional significant differences between the three phase distribution line characteristics (parameters) and those of one phase lines, and the result is that no single monitored parameter has reliability, and multiple parameters must be simultaneously monitored to have significant reliability. The invention is truly a combination of invention components, one set for three different parameters for monitoring three phase, and a different set for monitoring single phase.

The term "ground fault" as used herein, is meant to reference a disruption caused by a live wire or other live electric component unintentionally contacting a conductor, such as a conductive structure, the ground, a body of water, etc. The term "broken line" as used herein shall be taken broadly to include live wires, live connectors, live splices and splice components that have experienced a break in the circuitry with a short or fault that has or is about to occur.

Referring now in detail to the drawings wherein like reference numerals designate corresponding parts throughout the several views, various embodiments of the present invention system are shown.

The standard in the industry is to monitor the distribution system to recognize a ground fault and to react to it using aforementioned low sensitivity relays. The conventional steps of the PRIOR ART are shown in FIG. 1, block 1 (Prior Art Electric Distribution Relay Protection System) are:

(1) deploy conventional low sensitivity (LS) relays along distribution lines, block 3;

(2) program these LS relays to monitor macro changes in electric conditions along the lines to identify when a ground fault has occurred, block 5;

(3) send a trip signal to the appropriate breaker to shut down the breaker after the ground fault has occurred, with possible collateral damage and possible catastrophic damage, block 7;

(4) shift power as quickly as possible to by-pass (isolate) the broken line to other transmission lines to minimize disruption, block 9 (this occurs with existing equipment and grid configurations as the transmission system reconfigures);

(5) locate the broken line and repair/replace it, block 11, and;

(6) restore power to the previously broken line, block 13.

This prior art procedure seems to be used frequently, if not universally, but has the disadvantages of slow response, and of collateral damage, ranging from minor property, livestock or flora and fauna damage, to significant collateral damage-fires, destruction and the like, to catastrophic collateral damage-loss life or many lives, destruction of valuable property, such as in the millions or even hundreds of millions of dollars, and even destruction of entire communities by fire. The parameters relied upon in these prior art systems are affected after a fault occurs, i.e., when it is too late to prevent collateral ground damage.

The present invention is directed to the elimination of all collateral and catastrophic damage caused by a short or ground fault in existing systems that presently use low sensitivity relays. This is achieved by utilizing micro monitoring programming in the high sensitivity relays to not look at ground faults, but to micro monitor small changes in characteristics that occur after a line is broken and before it shorts or grounds (that is, before it touches a pole, ground or other grounding object). "Micro" as used herein does not mean one millionth or other exact measurement, but rather is intended to connote very small measurements on a relative basis, such measurements involving characteristics for which flows are below 0.1 amps, and more specifically, those parameters set forth above and below. In this context, the present invention measurements are typically at least an order of magnitude smaller than present commercial relay measurements that occur upon a short or ground fault. For lower range high voltage systems, the present invention methods are monitoring conditions that are two or even three orders of magnitude smaller. Further, in the present invention methods, timing is critical and the conditions measured are different and critical. This unique approach enables circuit breaking devices to be shut down (and hence cease electric flow) before any collateral damage could otherwise occur.

Figure 2:
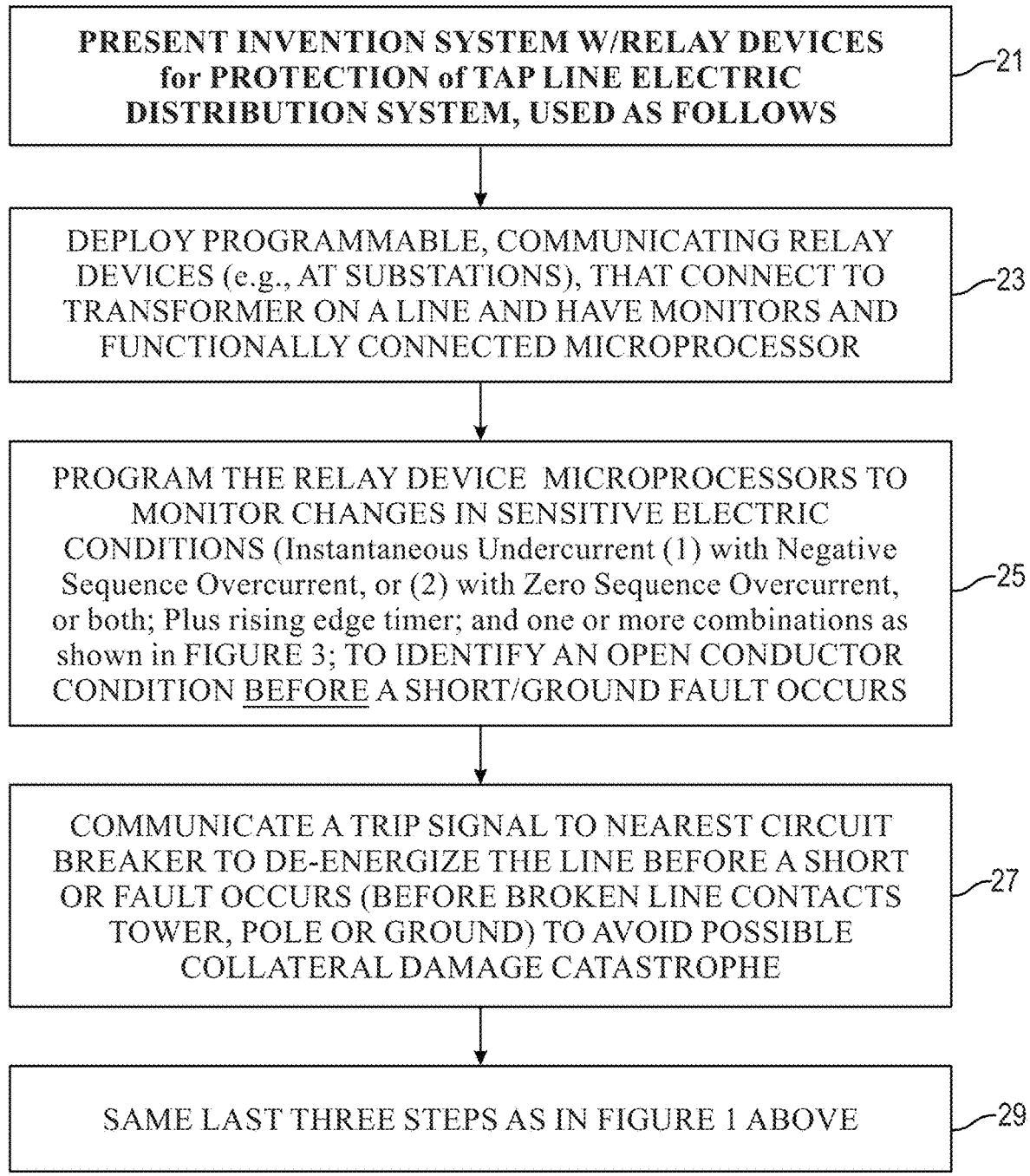
FIG. 2 is a block diagram showing some of the features of a Present Invention electric distribution relay protection system device that includes monitors and a specifically programmed microprocessor having small change monitoring of selected parameters. The high sensitivity relay devices use micro monitoring of highly sensitive line conditions- namely, one of which is instantaneous undercurrent, and the other is negative sequence overcurrent or zero sequence overcurrent.

FIG. 2 shows the steps in the present invention ground fault prevention system with its electric distribution relay protection system on a three-phase primary distribution line tap line, block 21, with a blown fuse protection subsystem and preferred embodiments include these steps:

(1) deploy programmable, high sensitivity relays along distribution tap lines via current transformers, preferably at or near the substations, block 23. These relays each have a microprocessor and monitors operating off electricity from said transformers. Signaling to circuit breaking devices must be very rapid, such as radio, direct wire or preferably optical fiber communications;

(2) program these high sensitivity relay microprocessors to monitor micro changes in electric conditions, block 25, namely: a) instantaneous undercurrent; with either or both of b) negative sequence overcurrent and c) zero sequence overcurrent, and in addition, one or more combinations of conditions shown in FIG. 3, not shown in this Figure, but option yet preferred monitoring, along the three phase lines to identify when a line break has occurred and to do so before the broken line creates a fault, block 25, (before it touches a tower, pole or ground), e.g., within a half-second and preferably within a few milliseconds;

(3) rapidly signal to the appropriate circuit breaking devices to shut them down near the break before the ground fault has occurred, block 27 (again within a half-second and preferably within a few milliseconds) to avoid collateral damage or catastrophe, had the ground fault actually occurred;

(4) shift or by-pass (isolate) power as quickly as possible to minimize disruption, block 29 (this occurs with existing equipment and distribution configurations as the system may reconfigure);

(5) locate the broken line and repair/replace it, and;

(6) restore power to the previously broken line.

By the present methods and devices, it can now be seen that the speed in which the monitoring and corrective action takes place is a fraction of a second or a second. Due to the present invention methods, shut down occurs before a fault occurs, no damage results, and easier, safer and quicker broken line repair is achieved. FIG. 3 illustrates a block diagram showing some of the features of a Present Invention electric distribution relay protection subsystem 39, which in block 39 illustrates the generic expression of functionality of the special monitoring, either alone or with one or both of modules A and B.

Figure 4:
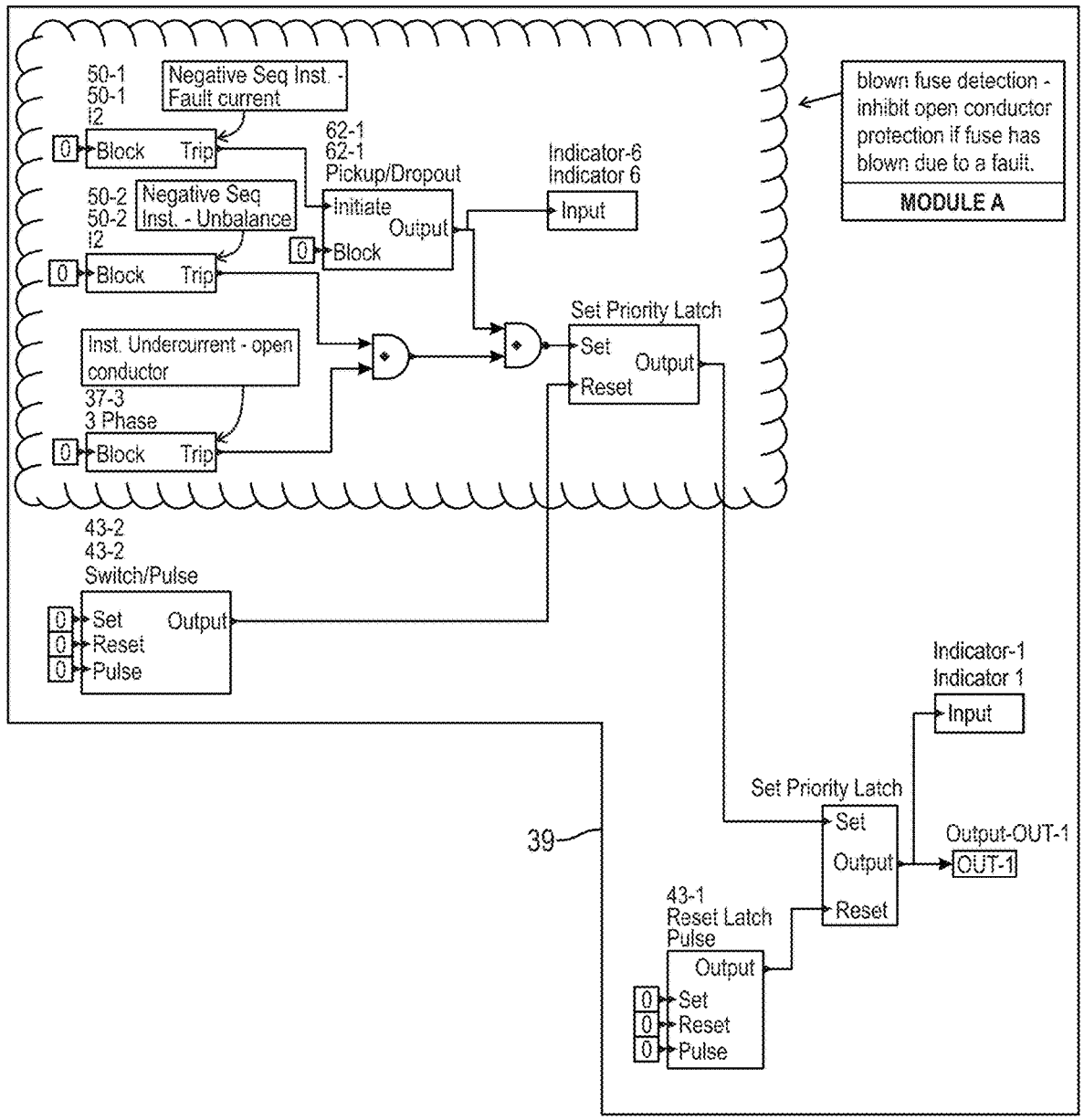
FIGS. 4, 5 and 6 show symbolic diagrams of various MODULE A and/or MODULE B options for detailed present invention electric distribution lines subsystems; and, FIG. 7 shows an alternative combination of the salient features of MODULES A and B.
Figure 5:
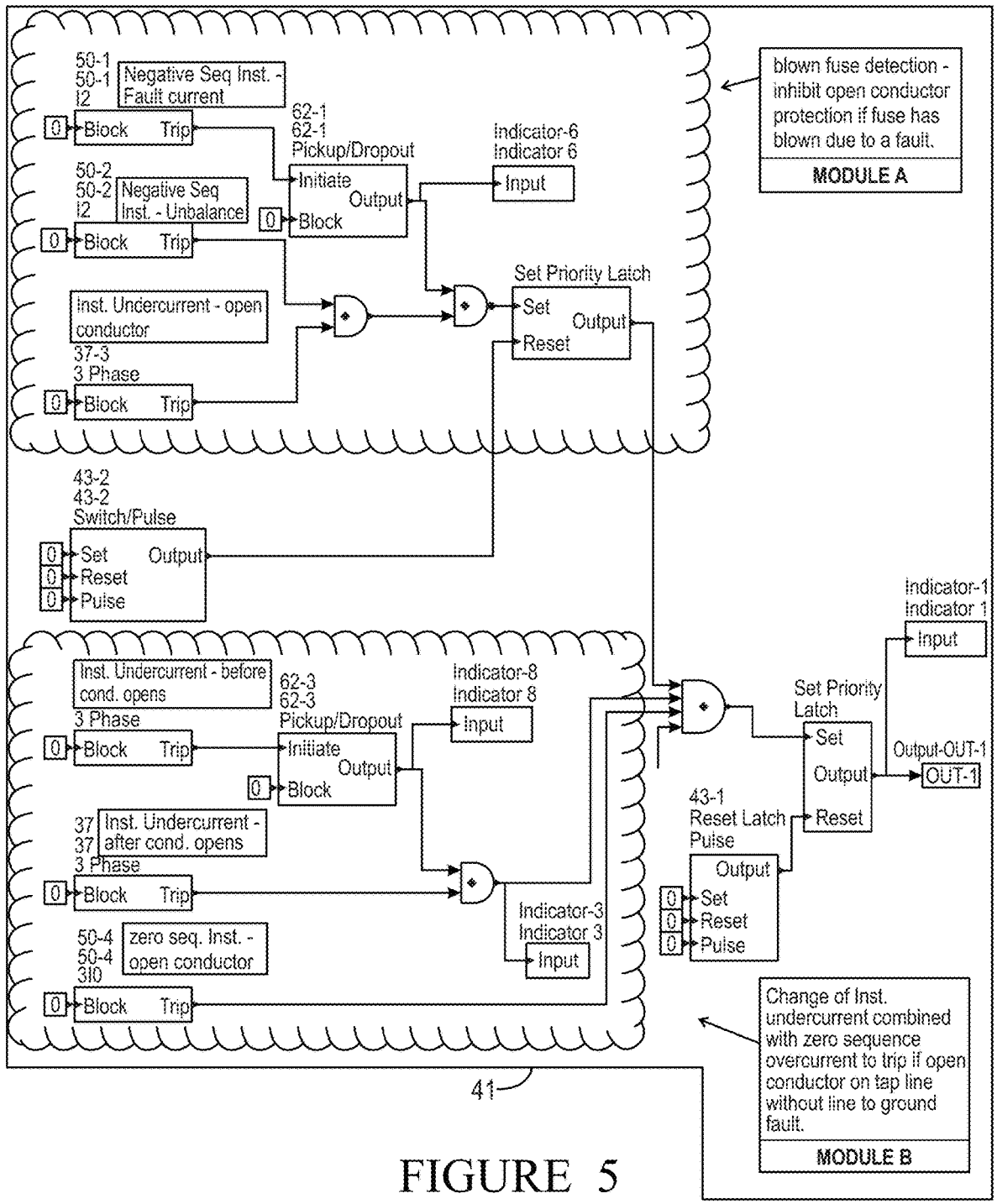

FIGS. 4 and 5 show present invention electric distribution line monitoring special symbolic logic diagrams with block 39 of FIG. 4 illustrating module A in its simplest form. Likewise, in FIG. 5, block 41 shows modules A and B in combination.

Figure 6:
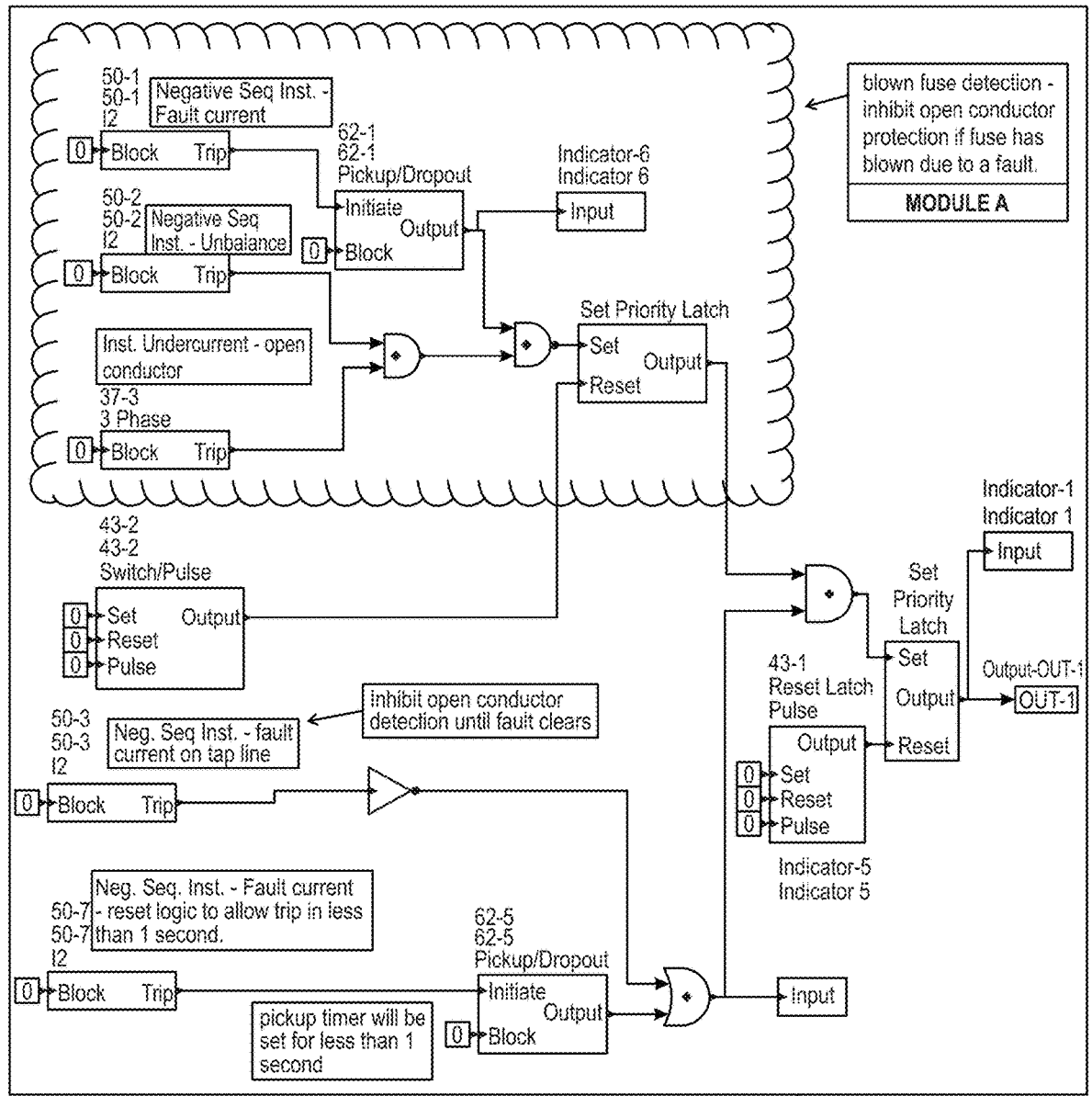

FIG. 6, block 43, illustrates a preferred present invention subsystem module A with the added open conduction detection inhibited until the fault is cleared. This involves additional monitoring—the instantaneous negative sequence when there is a fault current on the tap line wherein there is a timed reset logic as shown with a pick-up timer set for less than 1 second, and typically for a small fraction of a second.

Figure 7:
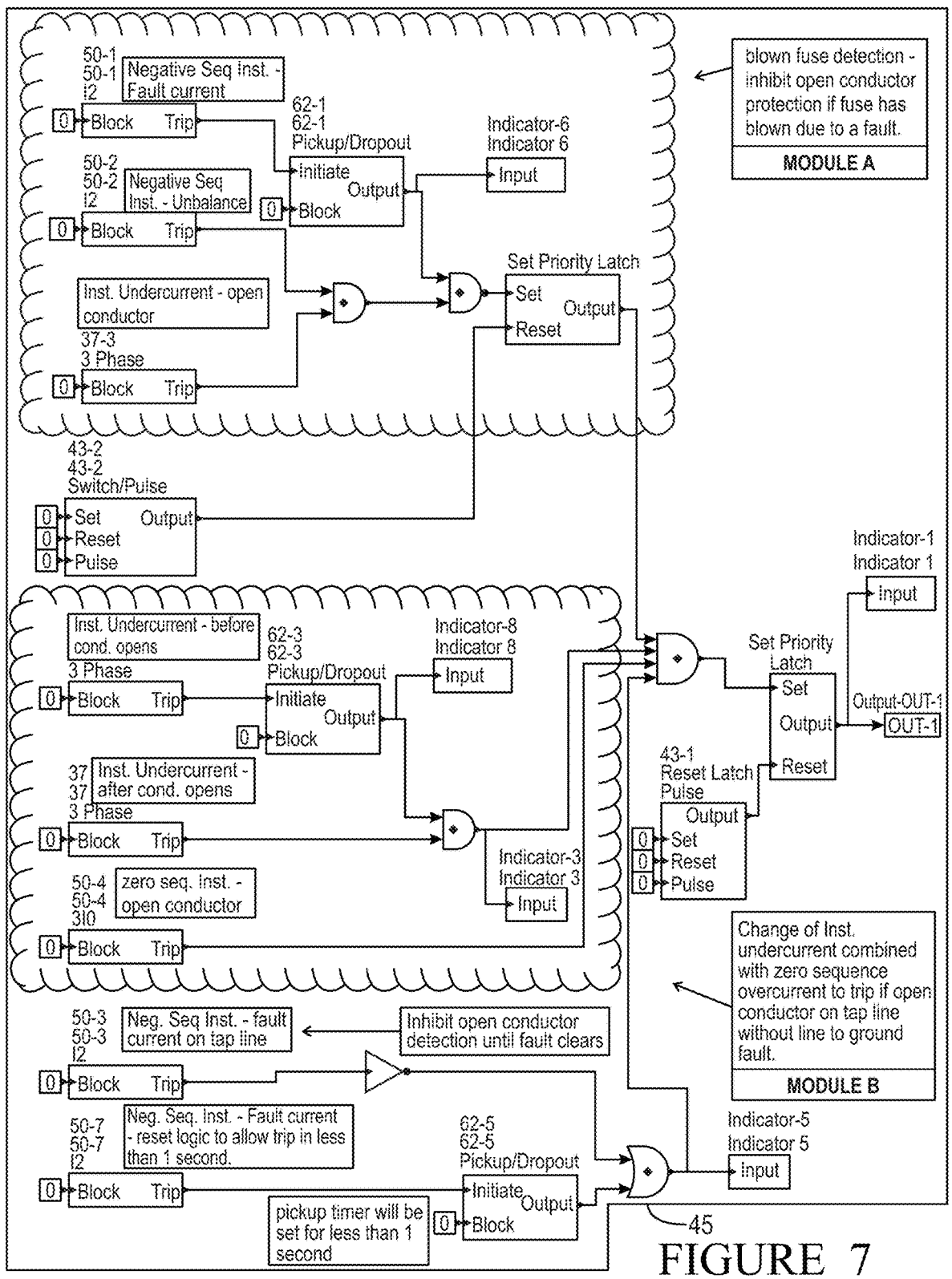

FIG. 7, block 45, illustrates a preferred present invention subsystem that includes both module A and module B, with the added open conduction detection inhibited until the fault is cleared. As indicated above relative to FIG. 6, this involves additional monitoring—the instantaneous negative sequence when there is a fault current on the tap line wherein there is a timed reset logic as shown with a pick-up timer set for less than 1 second, and typically for a small fraction of a second. Note that all gates in FIGS. 4 and 5 are AND gates, and those AND gates repeat in FIGS. 6 and 7, except that the additional pick-up timer and delay monitoring feature utilizes an OR gate shown at the bottom of each of FIGS. 6 and 7.

As indicated above, the Parent Application is incorporate herein is captured in its entirety. Reference is especially made to that Parent Application's FIGS. 10, 11, 12 and 13 that collectively show examples of a present invention system in normal modes with no open conductors, and in open conductor modes wherein the present invention respond extremely rapidly.

The present invention for detecting open conductors in distribution circuits is unique and unprecedented. This protection will work for any distribution feeder of any length and voltage. The logic utilizes extremely sensitive undercurrent and negative sequence overcurrent protection coupled with internal logic elements unique to the Basler Flex relay to detect open conductors in three phase lines and single phase tap lines fed from the three phase main line. (Such relays, which may be utilized in all present invention embodiments, but are not programmed as in the present invention to monitor the specific characteristics of the present inventions systems, have sufficient inputs, programmability and high sensitivity (very low reading capability) that they may be modified (programmed) for present invention applications. Low readings of 0.01 amps and even 0.001 amps, are preferred.)

This invention uses a combination of extremely sensitive undercurrent relay elements combined with extremely sensitive negative sequence overcurrent relay elements to sense whether a conductor has opened or not and initiate a trip signal to the main feeder circuit breaker of downstream circuit recloser to deenergize the circuit almost immediately before either end of the open conductor makes contact with the ground or touches a grounded structure. Discussion of this invention will be broken into discussion of three phase main line open conductor protection and single phase tap line open conductor protection.

To summarize the "single phase" open conductor logic will be able to reliably detect an open conductor in a single phase tap line immediately on the load side of the interrupting device (relay location) and the end of line using extremely sensitive and accurate rate of change of current detection. This then would protect 100% of the single phase line for open conductors.

Although particular embodiments of the invention have been described in detail herein with reference to the accompanying drawings, it is to be understood that the invention is not limited to those particular embodiments, and that various changes and modifications may be affected therein by one skilled in the art without departing from the scope or spirit of the invention as defined in the appended claims. For example, the shapes of the various components herein may be changed; specific relays may be modified or enhanced; communications may be by radio or fiber optics or by any rapid communication system that is or becomes available.

What is claimed is:

1. A system for preventing ground fault or other short circuit in an electric distribution line system, caused by a break in a line, utilizing programmable relay protection in a plurality of relay devices programmed to monitor high sensitivity parameters, which includes blown fuse protection in a single phase tap line to prevent false operation of the open conductor logic when a tap line fuse successfully interrupts a short circuit on the tap line, which comprises:

a blown fuse protection subsystem having a tap line with a plurality of current transformers on said tap line with a plurality of relay devices functionally connected to said transformers by being connected to secondary stepdown windings of said current transformers, said relay devices being for monitoring high sensitivity parameters on said tap line, said devices being relay devices for said tap line, having a housing, and each said relay device having connections with an incoming line and an outgoing line for connection to current transformers on said tap line, and having a plurality of monitors, and having a programmable microprocessor functionally connected to said monitors, said programmable microprocessor being-programmed for micro-monitoring segments of said tap line as follows: to detect changes in negative sequence overcurrent on said single phase tap line, to calculate the change in negative sequence overcurrent, to store a preset acceptable range for change of negative sequence overcurrent, to compare said calculated change in negative sequence overcurrent to said preset acceptable range for change of negative sequence overcurrent, and further programmed to perform the following process:

a) if there is a signal indicating a potential line break fault from the high sensitivity monitoring and, if the calculated change in negative sequence overcurrent is within said preset acceptable range for change of negative sequence overcurrent, then there is no blown fuse, and the blown fuse protection subsystem signals to permit said high sensitivity monitoring to proceed to signal a true broken conductor for line shut down of said tap line; and, b) if there is a signal indicating a potential line break fault from the high sensitivity monitoring and, if the calculated change in negative sequence overcurrent is outside said preset acceptable range of change of negative sequence overcurrent, then there is a blown fuse, and the high sensitivity monitoring does not proceed to signal a true line break fault for line shut down of said tap line.

2. The system of claim 1 wherein said subsystem includes a blown fuse detection module, designated as module A, having: (i) an instantaneous negative sequence overcurrent monitor; (ii) an instantaneous negative sequence overcurrent imbalance monitor that receives pretimed negative sequence overcurrent readings and provides a calculated change of actual instantaneous negative sequence overcurrent, and said monitor further includes a comparator for comparing said calculated change in instantaneous negative sequence overcurrent to said preset acceptable range for change of instantaneous negative sequence overcurrent; and (iii) an instantaneous undercurrent monitor.

3. The system of claim 2, wherein module A monitors (ii) and (iii) pass through a first AND gate, and then pass through a second AND gate with module A monitor (i), and then collectively pass through a final AND gate.

4. The system of claim 2, wherein said subsystem also includes a change of instantaneous undercurrent module, designated as module B, on said tap line to detect a broken conductor break in a line.

5. The system of claim 4, wherein said instantaneous undercurrent module, that is, module B, includes (i) an instantaneous undercurrent monitor that reads instantaneous undercurrent before a conductor opens; (ii) an instantaneous undercurrent monitor that reads instantaneous undercurrent after a conductor opens; and (iii) an instantaneous zero sequence overcurrent monitor.

6. The system of claim 5, wherein module B monitors (i) and (ii) pass through a third AND gate, and then pass through a fourth AND gate with module B monitor (iii), and then collectively pass through said final AND gate.

7. The system of claim 1, wherein said programmable relay protection system plurality of relay devices are programmed to monitor high sensitivity line instantaneous undercurrent, and to monitor high sensitivity instantaneous negative sequence overcurrent to detect current imbalance of the load wherein a distribution tap line has opened due to a blown fuse, and wherein shutting down the power to a broken line is delayed by a preset time within the range of about 0.3 seconds to about 1 second to protect against a false shut down.

8. The system of claim 2, wherein said plurality of relay devices include module A, which are programmed to be highly sensitive so as to monitor and measure instantaneous undercurrent in the range of 0.01 to 0.5 amp.

9. The system of claim 2, wherein said plurality of relay devices include module A, which are programmed to be highly sensitive so as to monitor and measure instantaneous negative sequence overcurrent in the range of 0.01 to 0.5 amp.

10. The system of claim 1, wherein said programmable relay protection system plurality of relay devices are programmed to monitor high sensitivity line instantaneous undercurrent, and to monitor high sensitivity instantaneous negative sequence overcurrent to detect current imbalance of the load wherein a distribution tap line has opened, and wherein shutting down the power to a broken line is delayed by a preset time within the range of about 0.3 seconds to about 1 second to protect against a false shut down.

11. The system of claim 10, wherein said plurality of relay devices include module A, which are programmed to be highly sensitive so as to monitor and measure instantaneous undercurrent in the range of 0.01 to 0.5 amp.

12. The system of claim 10, wherein said plurality of relay devices include module A, which are programmed to be highly sensitive so as to monitor and measure instantaneous zero sequence overcurrent in the range of 0.01 to 0.5 amp.

13. The system of claim 5, wherein said monitors of module B are programmed to be highly sensitive so as to monitor and measure instantaneous undercurrent in the range of 0.01 to 0.5 amp.

14. The system of claim 5, wherein said monitors of module B are programmed to be highly sensitive so as to monitor and measure instantaneous zero sequence overcurrent in the range of 0.01 to 0.5 amp.

* * * * *